United States Patent
Oh et al.

(10) Patent No.: US 10,224,288 B2
(45) Date of Patent: Mar. 5, 2019

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventors: Kyung Seob Oh, Suwon-si (KR); Kyoung Moo Harr, Suwon-si (KR); Doo Hwan Lee, Suwon-si (KR); Seung Chul Oh, Suwon-si (KR); Hyoung Joon Kim, Suwon-si (KR); Yoon Suk Cho, Suwon-si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/728,064

(22) Filed: Oct. 9, 2017

(65) Prior Publication Data

US 2018/0033733 A1 Feb. 1, 2018

Related U.S. Application Data

(62) Division of application No. 15/420,558, filed on Jan. 31, 2017, now Pat. No. 9,881,873.

(30) Foreign Application Priority Data

Jun. 20, 2016 (KR) .................. 10-2016-0076654

(51) Int. Cl.
*H01L 23/31* (2006.01)
*H01L 23/538* (2006.01)
*H01L 23/498* (2006.01)

(52) U.S. Cl.
CPC ...... *H01L 23/5389* (2013.01); *H01L 23/3114* (2013.01); *H01L 23/5383* (2013.01);
(Continued)

(58) Field of Classification Search
CPC ............ H01L 23/5389; H01L 23/3114; H01L 23/5383; H01L 23/5384; H01L 23/5386; H01L 2224/02379
See application file for complete search history.

(56) References Cited

U.S. PATENT DOCUMENTS 8,084,850 B2 * 12/2011 Shin .................. H01L 23/24
257/684
8,354,304 B2 1/2013 Chow et al.
(Continued)

FOREIGN PATENT DOCUMENTS

KR 10-2005-0065300 A 6/2005
KR 10-2010-0011648 A 2/2010
(Continued)

OTHER PUBLICATIONS

U.S. Notice of Allowance dated Sep. 27, 2017 issued in U.S. Appl. No. 15/420,558.
(Continued)

*Primary Examiner* — Ida M Soward
(74) *Attorney, Agent, or Firm* — Morgan Lewis & Bockius LLP

(57) ABSTRACT

A fan-out semiconductor package includes a frame having a through hole, a semiconductor chip disposed in the through hole and including connection pads, an encapsulant encapsulating at least a portion of the frame and the semiconductor chip, and a redistribution layer disposed on the frame and the semiconductor chip and including a first region and a second region. In the first region, a first via and a second via, electrically connected to one of the connection pads, disposed in different layers, and connected by a wiring pattern, are disposed. In the second region, a third via and a fourth via, electrically connected to another of the connection pads, disposed in different layers, and connected by the wiring pattern, are disposed. A distance between axes of the first via
(Continued)

and the second via is shorter than a distance between axes of the third via and the fourth via.

8 Claims, 11 Drawing Sheets

(52) U.S. Cl.
CPC ...... *H01L 23/5384* (2013.01); *H01L 23/5386* (2013.01); *H01L 23/49816* (2013.01); *H01L 2224/02379* (2013.01); *H01L 2224/04105* (2013.01); *H01L 2224/12105* (2013.01); *H01L 2224/18* (2013.01); *H01L 2924/18162* (2013.01); *H01L 2924/3025* (2013.01); *H01L 2924/3511* (2013.01)

(56) References Cited

U.S. PATENT DOCUMENTS

| | | | |
|---|---|---|---|
| 8,810,024 B2 | 8/2014 | Lin et al. | |
| 9,159,547 B2 | 10/2015 | Rogers et al. | |
| 9,299,647 B2 | 3/2016 | McConnelee et al. | |
| 9,406,580 B2 | 8/2016 | Erhart et al. | |
| 9,508,638 B2 | 11/2016 | Wang et al. | |
| 9,699,909 B2* | 7/2017 | Ishiguro | H05K 1/185 |
| 9,711,465 B2 | 7/2017 | Liao et al. | |
| 9,735,129 B2* | 8/2017 | Chen | H01L 25/0655 |
| 9,865,525 B2* | 1/2018 | Lin | H01L 23/13 |
| 2005/0139988 A1 | 6/2005 | Ishida | |
| 2007/0289127 A1 | 12/2007 | Hurwitz et al. | |
| 2008/0237828 A1 | 10/2008 | Yang | |
| 2010/0019368 A1 | 1/2010 | Shin | |
| 2013/0032390 A1 | 2/2013 | Hu et al. | |
| 2013/0249101 A1 | 9/2013 | Lin et al. | |
| 2013/0270682 A1 | 10/2013 | Hu et al. | |
| 2014/0048906 A1 | 2/2014 | Shim et al. | |
| 2014/0061940 A1 | 3/2014 | Kitao et al. | |
| 2014/0103527 A1 | 4/2014 | Marimuthu et al. | |
| 2015/0107880 A1 | 4/2015 | Kim et al. | |
| 2015/0115466 A1 | 4/2015 | Kim | |
| 2015/0187695 A1 | 7/2015 | Yu et al. | |
| 2015/0187742 A1 | 7/2015 | Kwon et al. | |
| 2016/0079184 A1 | 3/2016 | Tsukiyama et al. | |
| 2016/0148873 A1 | 5/2016 | Chiang et al. | |
| 2016/0155695 A1* | 6/2016 | Shen | H01L 23/315 |
| | | | 257/676 |
| 2016/0307847 A1 | 10/2016 | Lee et al. | |
| 2016/0336249 A1 | 11/2016 | Kang et al. | |
| 2016/0338202 A1 | 11/2016 | Park et al. | |
| 2017/0033080 A1* | 2/2017 | Chen | H01L 25/0657 |
| 2017/0141063 A1 | 5/2017 | Lee et al. | |
| 2017/0179078 A1 | 6/2017 | Jung et al. | |
| 2017/0221830 A1* | 8/2017 | Scanlan | H01L 23/5385 |
| 2017/0250138 A1* | 8/2017 | Hsieh | H01L 23/5389 |
| 2017/0317029 A1* | 11/2017 | Hsieh | H01L 23/5386 |
| 2017/0330814 A1* | 11/2017 | Kang | H01L 23/3128 |
| 2017/0338204 A1* | 11/2017 | Lee | H01L 21/565 |
| 2017/0345762 A1* | 11/2017 | Chiu | H01L 23/5389 |
| 2017/0358548 A1* | 12/2017 | Lee | H01L 23/3114 |
| 2018/0005984 A1* | 1/2018 | Yu | H01L 23/49838 |
| 2018/0076159 A1* | 3/2018 | Chen | H01L 25/071 |
| 2018/0145044 A1* | 5/2018 | Park | H01L 23/48 |

FOREIGN PATENT DOCUMENTS

| | | |
|---|---|---|
| KR | 10-1362715 B1 | 2/2014 |
| KR | 10-2015-0046615 A | 4/2015 |
| KR | 10-2015-0049164 A | 5/2015 |
| KR | 10-2015-0079424 A | 7/2015 |
| TW | 201342557 A | 10/2013 |
| TW | 201419483 A | 5/2014 |
| TW | 201613050 A | 4/2016 |

OTHER PUBLICATIONS

U.S. Non-Final Office Action dated Sep. 14, 2017 issued in U.S. Appl. No. 15/420,558.
Taiwanese Office Action dated Apr. 27, 2018 issued in Taiwanese Patent Application No. 106103432 (with English translation).
Office Action issued in corresponding Korean Patent Application No. 10-2016-0076654, dated Dec. 12, 2018.

* cited by examiner

I-I'

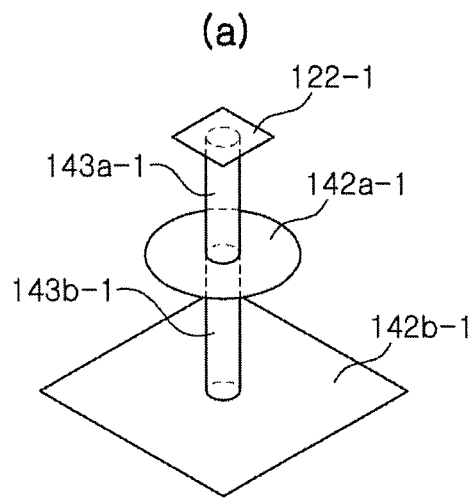
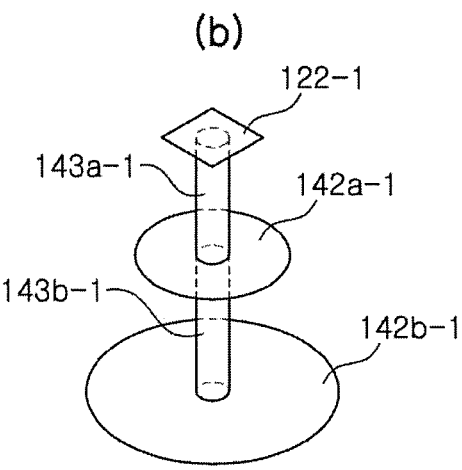
FIG. 11A  FIG. 11B
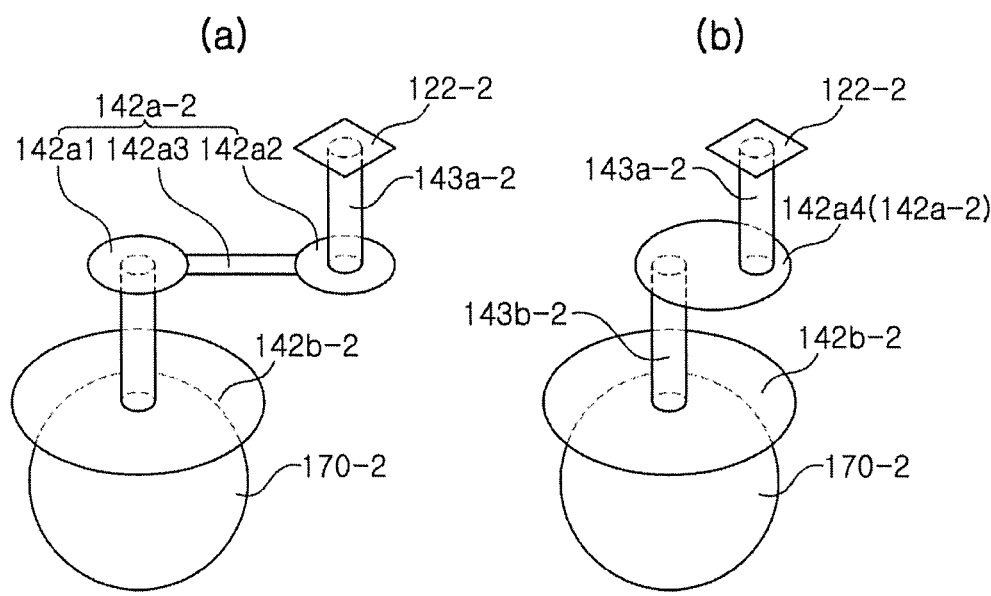
FIG. 12A  FIG. 12B

II-II'

III-III'

US 10,224,288 B2

FAN-OUT SEMICONDUCTOR PACKAGE

CROSS-REFERENCE TO RELATED APPLICATION

This application is a divisional patent application of U.S. patent application Ser. No. 15/420,558, filed on Jan. 31, 2017 which claims the benefit of priority to Korean Patent Application No. 10-2016-0076654, filed on Jun. 20, 2016 with the Korean Intellectual Property Office, the entireties of which are incorporated herein by reference.

TECHNICAL FIELD

The present disclosure relates to a semiconductor package, and more particularly, to a fan-out semiconductor package in which a connection terminal is not only disposed in a region in which a semiconductor chip is disposed, but also in a region outwardly thereof.

BACKGROUND

Semiconductor packages may refer to package technologies for electrically connecting a semiconductor chip to a printed circuit board (PCB), such as the motherboard of an electronic device, or the like, and for protecting a semiconductor chip from external impacts.

Recently, one of the main trends in the development of semiconductor chip technologies has been reductions in size of components. Therefore, in the field of semiconductor packages, due to a rapid increase in demand for small semiconductor packages, and the like, semiconductor chips are required to have a small size and a plurality of pins.

One package technology suggested in order to meet the demand for small semiconductor packages may be a fan-out semiconductor package. Fan-out semiconductor packages may have a small size and a plurality of pins in such a manner that connection terminals are not only redistributed to a region in which a semiconductor chip is disposed, but also outwardly thereof.

SUMMARY

An aspect of the present disclosure provides a fan-out semiconductor package having a novel structure, allowing for excellent performance and improvement of board level reliability.

An aspect of the present disclosure provides a fan-out semiconductor package in which a via of a second connection member corresponding to a central portion of a through hole of a first connection member in which the semiconductor chip is disposed is disposed in a manner different from a via of a second connection member corresponding to a region surrounding the central portion thereof.

According to an aspect of the present disclosure, a semiconductor package includes a first connection member having a through hole in a side surface thereof, a semiconductor chip disposed in the through hole of the first connection member and having an active surface on which connection pads are disposed and an inactive surface disposed opposite the active surface, an encapsulant encapsulating at least a portion of the first connection member and the semiconductor chip, and a second connection member disposed on the active surface of the first connection member and the semiconductor chip and including a first region corresponding to a central portion of the through hole and a second region, surrounding the first region, corresponding to the central portion of the through hole. In addition, the first region of the second connection member includes a first via and a second via, electrically connected to one of the connection pads, disposed in different layers, and connected by a redistribution layer, disposed therein. The second region of the second connection member includes a third via and a fourth via, electrically connected to another of the connection pads, disposed in different layers, and connected by the redistribution layer, disposed therein. A distance between axes of the first via and the second via is shorter than a distance between axes of the third via and the fourth via.

According to an aspect of the present disclosure, a semiconductor package includes a first connection member having a through hole in a different side surface thereof, a semiconductor chip disposed in the through hole of the first connection member and having an active surface on which connection pads are disposed and an inactive surface disposed opposite the active surface, an encapsulant encapsulating at least a portion of the first connection member and the semiconductor chip, and a second connection member disposed on the first connection member and the active surface of the semiconductor chip and including a first region corresponding to a central portion of the through hole and a second region, surrounding the first region, corresponding to the central portion of the through hole. In addition, stacked vias electrically connected to one of the connection pads are disposed in the first region of the second connection member. Staggered vias electrically connected to another the connection pads are disposed in the second region of the second connection member.

BRIEF DESCRIPTION OF DRAWINGS

The above and other aspects, features, and advantages of the present disclosure will be more clearly understood from the following detailed description when taken in conjunction with the accompanying drawings, in which:

FIGS. 11A and 11B are schematic enlarged views of portion "A" of the fan-out semiconductor package of FIG. 9;

FIG. 12A and FIG. 12B are schematic enlarged views of portion "B" of the fan-out semiconductor package of FIG. 9;

DETAILED DESCRIPTION

Figure 1:
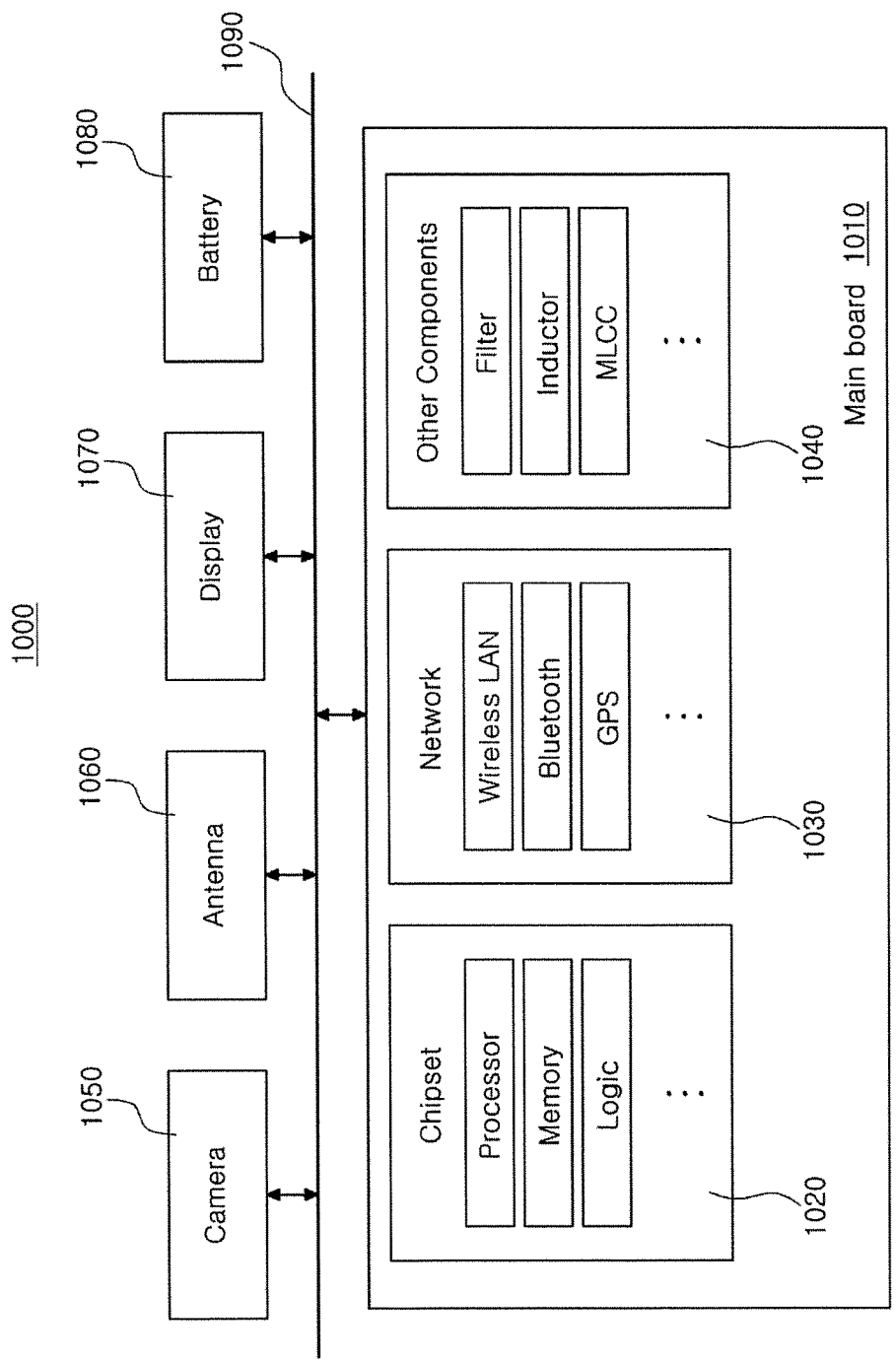
FIG. 1 is a block diagram schematically illustrating an example of an electronic device system.

Hereinafter, exemplary embodiments in the present disclosure will be described with reference to the accompanying drawings. In the accompanying drawings, shapes, sizes, and the like, of components may be exaggerated or shortened for clarity.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the attached drawings. For example, a first connection member is disposed on a level above a redistribution layer. However, the claims are not limited thereto. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Electronic Device

FIG. 1 is a schematic block diagram illustrating an example of an electronic device system.

With reference to FIG. 1, an electronic device 1000 may include a main board 1010. The main board 1010 may include a chipset 1020, a network 1030, other components 1040, and the like, which are physically and/or electrically connected to each other. The chipset 1020, the network 1030, other components 1040, and the like, may be connected to different components to be subsequently described, thus forming various signal lines 1090.

The chipset 1020 may include a memory chip, such as a volatile memory (e.g., a dynamic random access memory (DRAM)), a non-volatile memory (e.g., a read only memory (ROM)), a flash memory, or the like; an application processor chip, such as a central processor (e.g., a central processing unit (CPU)), a graphic processor (e.g., a graphic processing unit (GPU)), a digital signal processor, a cryptography processor, a microprocessor, a microcontroller, or the like; and a logic chip, such as an analog-to-digital converter, an application-specific IC (ASIC), or the like, but is not limited thereto. In addition, the chipset 1020 may include a chip-related component having a different form. Furthermore, the chipsets 1020 may be combined with each other.

The network 1030 may include Wi-Fi (IEEE 802.11 family, or the like), WiMAX (IEEE 802.16 family, or the like), IEEE 802.20, LTE (long term evolution), Ev-DO, HSPA+, HSDPA+, HSUPA+, EDGE, GSM, GPS, GPRS, CDMA, TDMA, DECT, Bluetooth, 3G, 4G, 5G, and different wireless/wired protocols, but is not limited thereto. In addition, the network 1030 may include any of a plurality of different wireless standards, wired standards or protocols. Furthermore, the network 1030 may be combined with the chipset 1020 described above.

The other components 1040 may include a high frequency inductor, a ferrite inductor, a power inductor, ferrite beads, low temperature co-fired ceramics (LTCC), an electromagnetic interference (EMI) filter, a multilayer ceramic capacitor (MLCC), or the like, but is not limited thereto. In addition, the other components 1040 may include passive components used for various different applications. Furthermore, the other components 1040 may be combined with the chipset 1020 and/or the network 1030, described above.

According to a type of the electronic device 1000, the electronic device 1000 may include a different component which may or may not be physically and/or electrically connected to the main board 1010. For example, the different component may include a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage device (e.g., a hard disk drive) (not illustrated), a compact disk (CD) (not illustrated), a digital versatile disk (DVD) (not illustrated), or the like, but is not limited thereto. In addition, the different component may include a different component, or the like, used for various applications, according to a type of the electronic device 1000.

The electronic device 1000 may be provided as a smartphone, a personal digital assistant (PDA), a digital video camera, a digital still camera, a network system, a computer, a monitor, a tablet PC, a laptop computer, a netbook, a television, a videogame console, a smartwatch, an automobile, or the like, but is not limited thereto. In addition, the electronic device 1000 may be provided as a different electronic device processing data.

Figure 2:
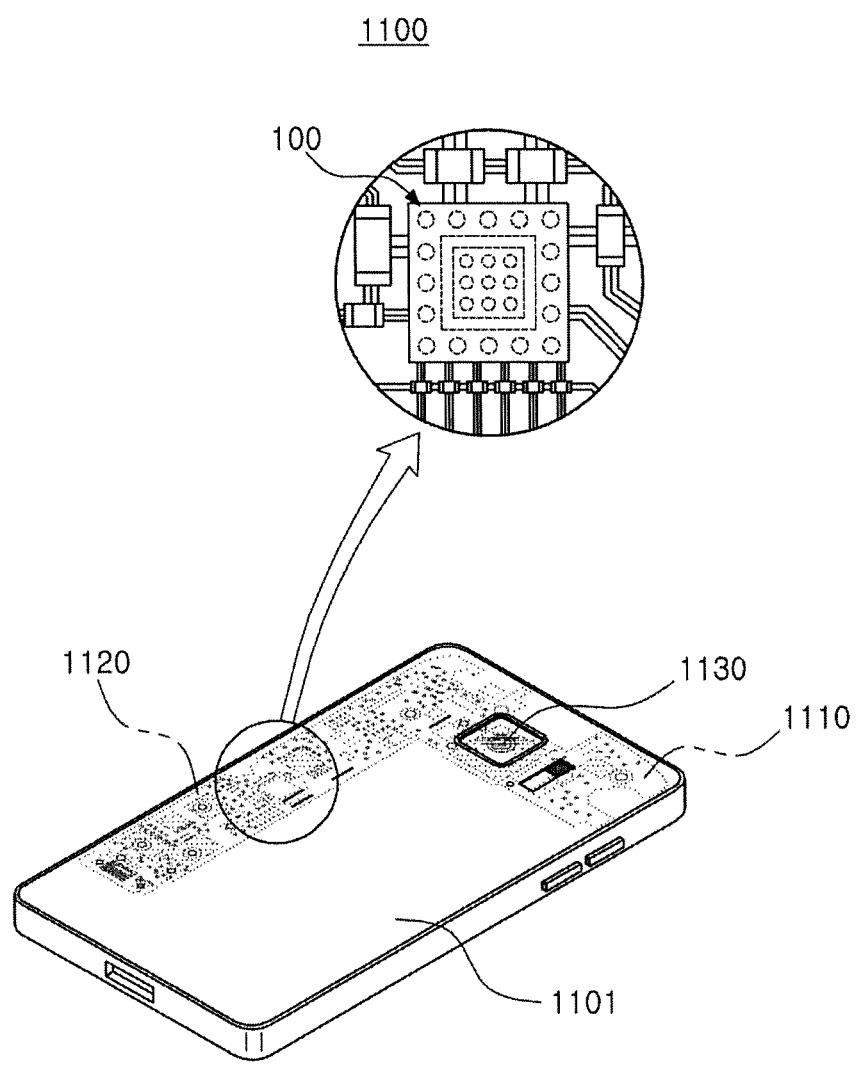
FIG. 2 is a perspective view schematically illustrating an example of an electronic device.

FIG. 2 is a schematic perspective view of an example of an electronic device.

With reference to FIG. 2, a semiconductor package may be applied to various electronic devices described above in order to be used for various applications. In detail, a smartphone 1100 may include a motherboard 1110 disposed in a body 1101 thereof, while the motherboard 1110 may include various components 1120 physically and/or electrically connected to each other. In addition, a different component, such as a camera module 1130, which may be or may not be physically and/or electrically connected to the motherboard 1110, may be included in the body 1101. In this case, a portion among the components 1120 may be provided as a chip-related component, as illustrated above. In detail, a semiconductor package 100 may be provided as an application processor among the chipsets, but is not limited thereto. The electronic device may not be limited to the smartphone 1100, but may be provided as a different electronic device, as illustrated above.

Semiconductor Package

Generally, a number of fine electrical circuits may be integrated into a single semiconductor chip. However, the semiconductor chip may not serve as a finished semiconductor product in itself, and may be damaged due to external physical or chemical impacts. Therefore, the semiconductor chip itself is not used, but is packaged and is used in an electronic device, or the like, in a packaged state.

Here, semiconductor packaging is required due to the existence of a difference in circuit width between a semiconductor chip and a main board of an electronic device in terms of electrical connectivity. In detail, a size of connection pads of the semiconductor chip and an interval of the connection pads of the semiconductor chip are very fine, but a size of component mounting pads of the main board used in the electronic device and an interval between the component mounting pads of the main board used are significantly larger than a scale of the semiconductor chip. Therefore, it may be difficult to directly mount the semiconductor chip on the main board, and packaging technology for buffering a difference in circuit width between the semiconductor chip and the main board is required.

The semiconductor package manufactured by the packaging technology may be classified as a fan-in semiconductor package and a fan-out semiconductor package, depending on a structure and a purpose thereof.

Hereinafter, the fan-in semiconductor package and the fan-out semiconductor package will be described in more detail with reference to the drawings.

Fan-in Semiconductor Package

Figure 3B:
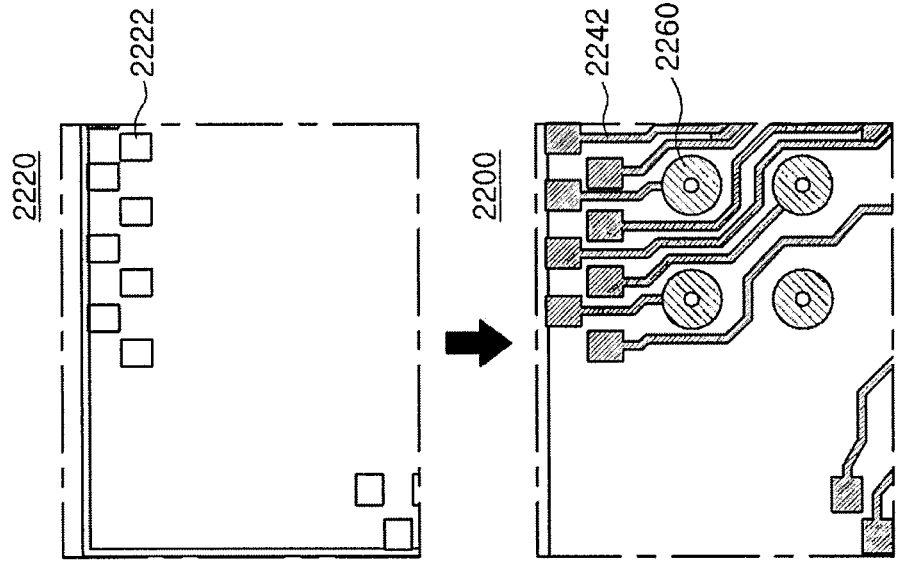
FIGS. 3A and 3B are schematic cross-sectional views illustrating a fan-in semiconductor package before and after packaging.
Figure 3A:
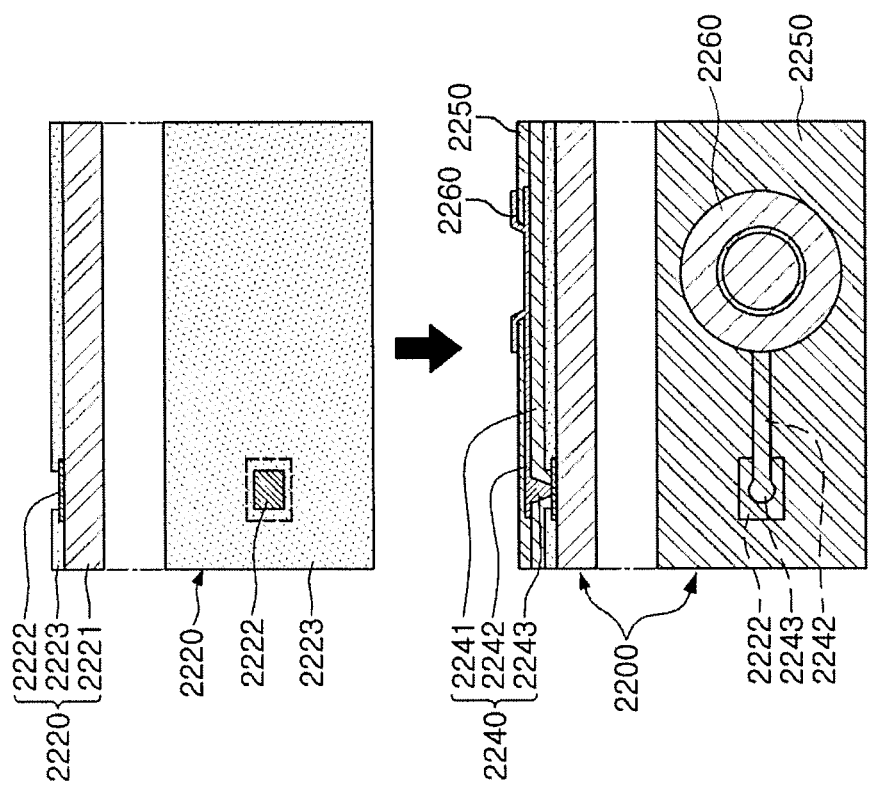

FIGS. 3A and 3B are schematic cross-sectional views illustrating a fan-in semiconductor package before and after packaging.

Figure 4:
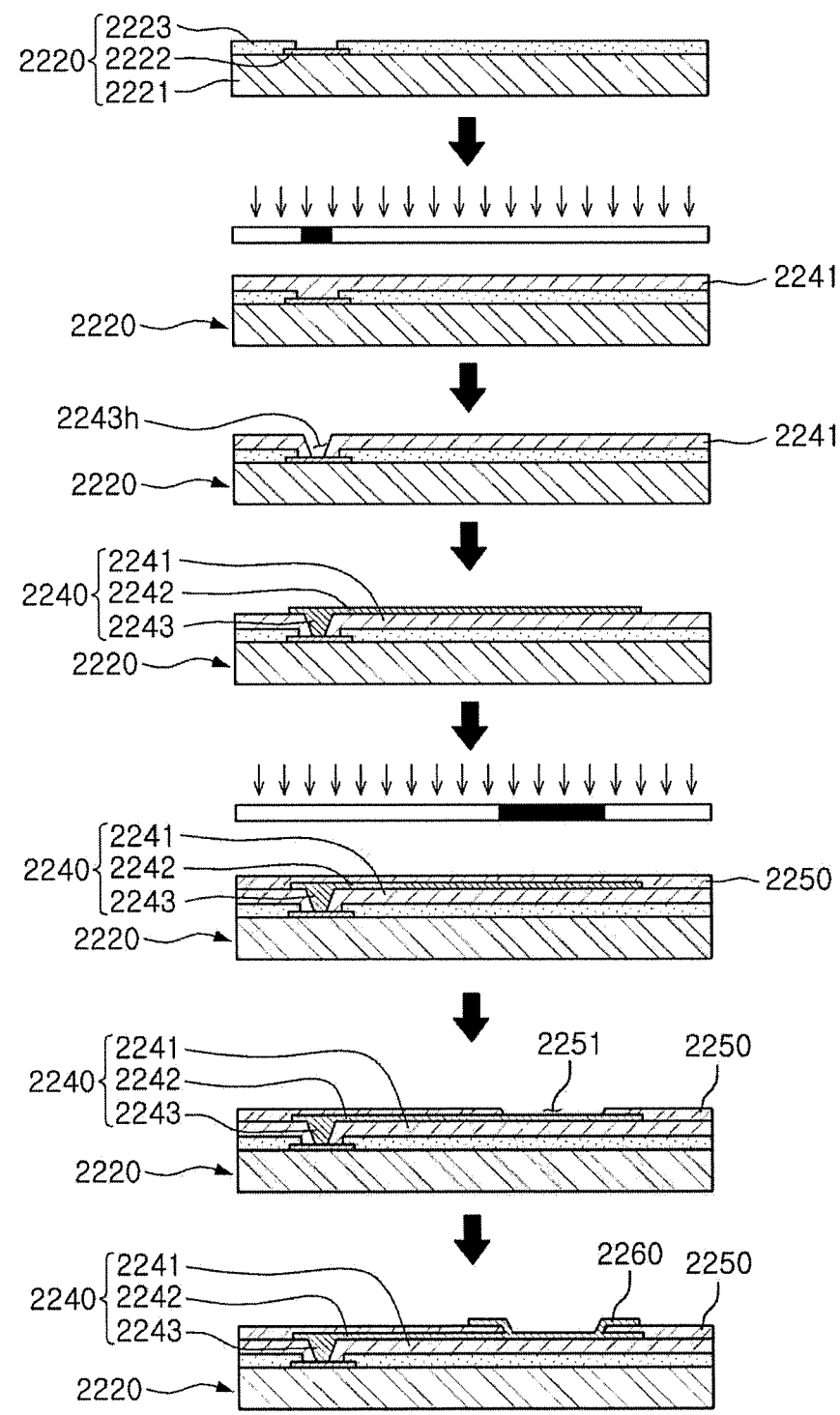
FIG. 4 is a schematic cross-sectional view illustrating a packaging process of a fan-in semiconductor package.

FIG. 4 is a schematic cross-sectional view illustrating a packaging process of a fan-in semiconductor package.

With reference to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation film 2223 such as an oxide film, a nitride film, or the like, formed on one surface of the body 2221 and covering at least a portion of the connection pads 2222. In this case, since the connection pads 2222 are significantly small, it may be difficult to mount the integrated circuit (IC) on an intermediate level printed circuit board (PCB) as well as a main board of an electronic device, or the like.

Therefore, a connection member 2240 may be formed on the semiconductor chip 2220, depending on a size of the semiconductor chip 2220, in order to redistribute the connection pads 2222. The connection member 2240 may be formed by forming an insulating layer 2241 on the semiconductor chip 2220 using an insulating material such as a photoimageable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an under bump metal layer 2260, or the like may be formed. That is, a fan-in semiconductor package 2200 including, for example, the semiconductor chip 2220, the connection member 2240, the passivation layer 2250, and the under bump metal layer 2260 may be manufactured through a series of processes.

As described above, the fan-in semiconductor package may have a package form in which all connection pads, for example, input/output (I/O) terminals, of the semiconductor chip are disposed inside an element, may have excellent electrical characteristics and may be able to be produced at low cost. Therefore, many elements mounted in a smartphone have been manufactured in a fan-in semiconductor package form. In detail, many elements mounted in a smartphone have been developed to implement a rapid signal transfer while having a compact size.

However, since all I/O terminals are required to be disposed inside the semiconductor chip in the fan-in semiconductor package, the fan-in semiconductor package has a significant spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. In this regard, even in the case in which a size of the I/O terminals of the semiconductor chip and an interval between the I/O terminals of the semiconductor chip are increased in a redistribution process, the size of the I/O terminals of the semiconductor chip and the interval between the I/O terminals of the semiconductor chip are not sufficient to directly mount the fan-in semiconductor package on the electronic device main board.

Figure 5:
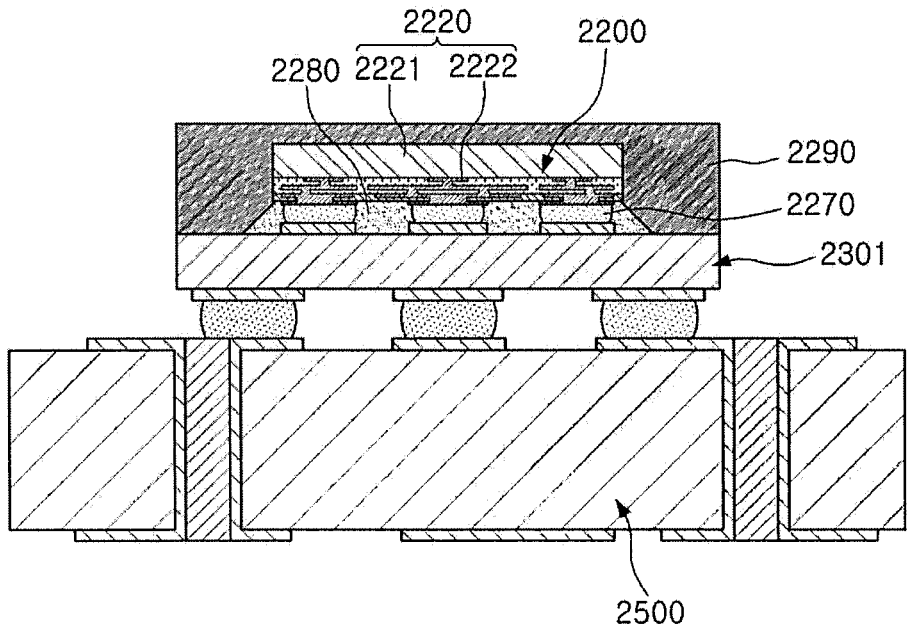
FIG. 5 is a schematic cross-sectional view illustrating a case in which a fan-in semiconductor package is mounted on an interposer substrate to ultimately be mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
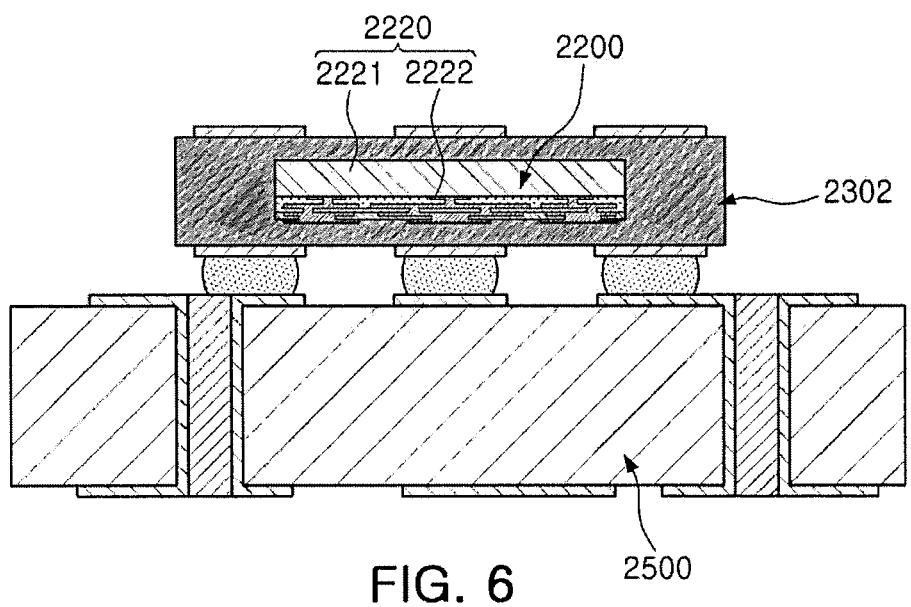
FIG. 6 is a schematic cross-sectional view illustrating a case in which a fan-in semiconductor package is embedded in an interposer substrate to ultimately be mounted on a main board of an electronic device.

FIG. 6 is a schematic cross-sectional view illustrating a case in which a fan-in semiconductor package is embedded in an interposer substrate and is ultimately mounted on a main board of an electronic device.

With reference to the drawings, in the fan-in semiconductor package 2200, connection pads 2222, that is, I/O terminals, of a semiconductor chip 2220 may be redistributed through an interposer substrate 2301, and the fan-in semiconductor package 2200 may ultimately be mounted on a main board 2500 of an electronic device in a state in which the electronic device is mounted on the interposer substrate 2301. In this case, solder balls 2270, and the like, may be fixed to an underfill resin 2280, or the like, and an outer side of the semiconductor chip 2220 may be covered with a molding material 2290, or the like. Alternatively, the fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package is embedded in the interposer substrate, and the fan-in semiconductor package may ultimately be mounted on the main board 2500 of an electronic device.

As described above, it may be difficult to directly mount and use the fan-in semiconductor package on the main board of the electronic device. Therefore, the fan-in semiconductor package may be mounted on a separate interposer substrate, and then, mounted on the main board of the electronic device through a packaging process or may be mounted and used on the main board of the electronic device in a state in which it is embedded in the interposer substrate.

Fan-out Semiconductor Package

Figure 7:
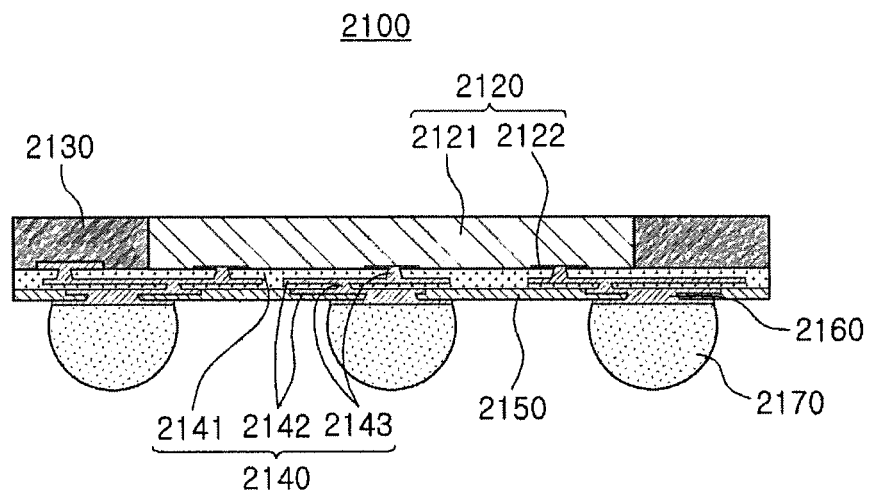
FIG. 7 is a schematic cross-sectional view illustrating a fan-out semiconductor package.

FIG. 7 is a schematic cross-sectional view illustrating a fan-out semiconductor package.

With reference to the drawings, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and under bump metal layers 2160 may be further formed in openings of the passivation layer 2150. Solder balls 2170 may be further formed on the under bump metal layers 2160. The semiconductor chip 2120 may be an integrated circuit (IC) including a body 2121, the connection pads 2122, a passivation film (not shown), and the like. The connection member 2140 may include an insulating layer 2141, redistribution layers 2142 formed on the insulating layer 2241, and vias 2143 electrically connecting the connection pads 2122, the redistribution layers 2142, and the like, to each other.

As described above, the fan-out semiconductor package may have a form in which I/O terminals are redistributed and disposed outwardly of the semiconductor chip through the connection member formed on the semiconductor chip. As described above, in the fan-in semiconductor package, all I/O terminals of the semiconductor chip are required to be disposed inside the semiconductor chip. Therefore, a size of an element is decreased, a size and a pitch of balls are required to be decreased, such that a standardized ball layout may not be used in the fan-in semiconductor package. On the other hand, the fan-out semiconductor package has a form in which the I/O terminals are redistributed and disposed outwardly of the semiconductor chip through the connection member formed on the semiconductor chip as described above. Therefore, even in the case that a size of the semiconductor chip is decreased, a standardized ball layout may be used in the fan-in semiconductor package as it is, such that the fan-in semiconductor package may be mounted on the main board of the electronic device without using a separate interposer substrate, as described below.

Figure 8:
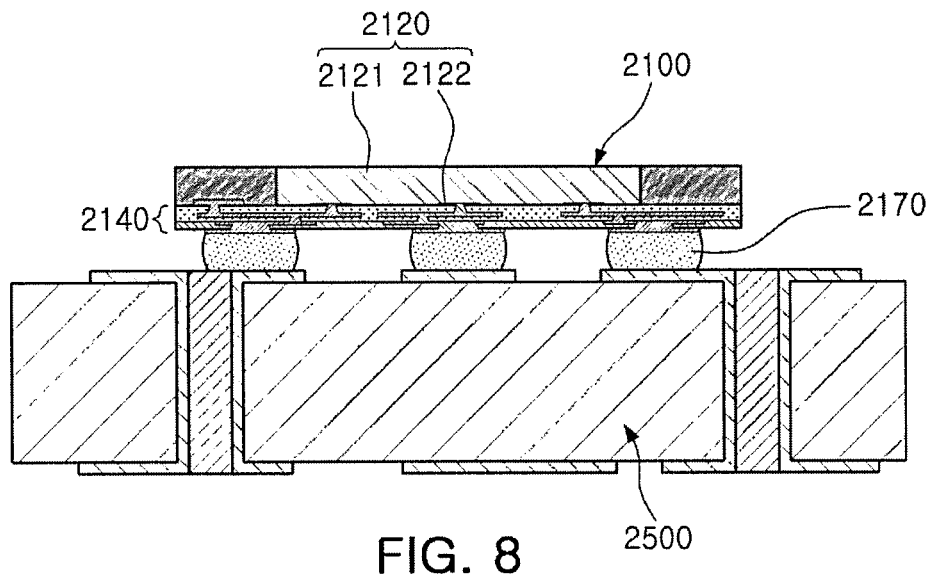
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

With reference to the drawings, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size range of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without a separate interposer substrate, the fan-out semiconductor package may be implemented at a thickness less than that of the fan-in semiconductor package using the interposer substrate. Therefore, the fan-in semiconductor package may be miniaturized and thinned. In addition, the fan-in semiconductor package has excellent thermal characteristics and electrical characteristics, such that it is particularly appropriate for a mobile product. Therefore, the fan-in semiconductor package may be implemented in a form more compact than that of a general package on package (POP) type semiconductor package using a printed circuit board (PCB), and may solve a problem due to the occurrence of a warpage phenomenon.

Meanwhile, the fan-out semiconductor package refers to a package technology for mounting the semiconductor chip on the main board of the electronic device, or the like, as described above, and protecting a semiconductor chip from external impacts, and is a concept different from that of a printed circuit board (PCB) such as an interposer substrate, or the like, having a scale, a purpose, and the like, different from those of the fan-in semiconductor package, and having the fan-in semiconductor package embedded therein.

Hereinafter, a fan-out semiconductor package having excellent performance and improved board level reliability may be described with reference to the drawings.

Figure 9:
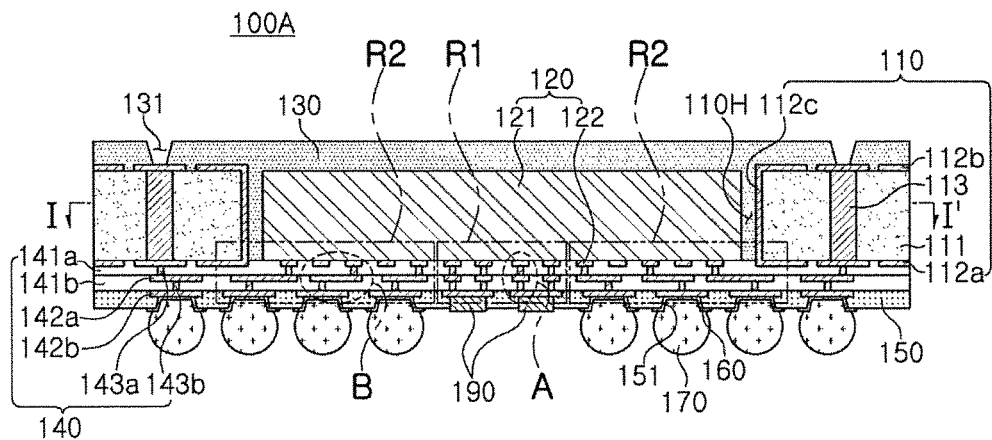
FIG. 9 is a schematic cross-sectional view illustrating an example of a fan-out semiconductor package.

FIG. 9 is a schematic cross-sectional view illustrating an example of a fan-out semiconductor package.

Figure 10:
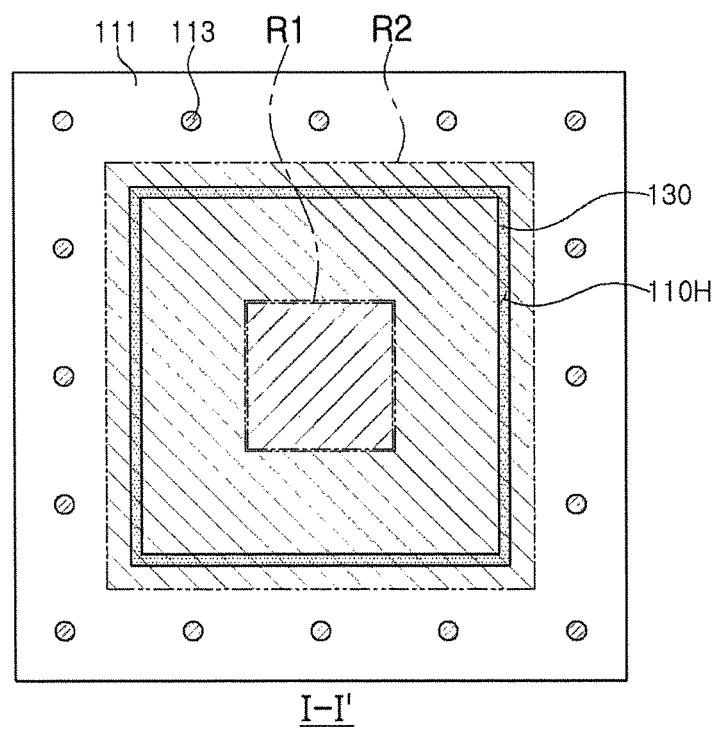
FIG. 10 is a schematic plan view taken along line I-I' of the fan-out semiconductor package of FIG. 9.

FIG. 10 is a schematic plan view taken along line I-I' of the fan-out semiconductor package of FIG. 9.

FIGS. 11A and 11B are schematic enlarged views of portion "A" of the fan-out semiconductor package of FIG. 9.

FIGS. 12A and 12B are schematic enlarged views of portion "B" of the fan-out semiconductor package of FIG. 9.

With reference to the drawings, a fan-out semiconductor package 100A, according to an exemplary embodiment, may include a first connection member 110 having a through hole 110H; a semiconductor chip 120 disposed in the through hole 110H of the first connection member 110 and including a connection pad 122 (for example, a connection pad 122-1 and/or a connection pad 122-2); an encapsulant 130 encapsulating at least a portion of the first connection member 110 and the semiconductor chip 120; a second connection member 140 disposed on a side of the first connection member 110 and the semiconductor chip 120 and including a first region R1 corresponding to a central portion of the through hole 110H and a second region R2 surrounding the first region R1; a passivation layer 150 disposed on a side of the second connection member 140; an under bump metal layer 160 formed in an opening 151 of the passivation layer 150; and a connection terminal 170 formed on the under bump metal layer 160.

In the first region R1 of the second connection member 140, a first via 143a-1 and a second via 143b-1, electrically connected to a first connection pad 122-1, disposed in different layers, and connected by a first redistribution layer 142a-1, may be disposed. In the second region R2 of the second connection member 140, a third via 143a-2 and a fourth via 143b-2, electrically connected to a second connection pad 122-2, disposed in different layers, and connected by a third redistribution layer 142a-2, may be disposed. In this case, a distance between axes of the first via 143*a*-1 and the second via 143*b*-1 may be different from that between axes of the third via 143*a*-2 and the fourth via 143*b*-2.

In more detail, the distance between the axes of the first via 143*a*-1 and the second via 143*b*-1 may be shorter than that between the axes of the third via 143*a*-2 and the fourth via 143*b*-2. For example, the axes of the first via 143*a*-1 and the second via 143*b*-1 may be disposed to correspond to each other, while the axes of the third via 143*a*-2 and the fourth via 143*b*-2 may be disposed to be offset from each other. In other words, the first via 143*a*-1 and the second via 143*b*-1 may be provided as stacked vias, while the third via 143*a*-2 and the fourth via 143*b*-2 may be provided as staggered vias. In this case, "correspond" is a concept including not only a case in which axes are perfectly aligned with each other, but also a case in which the axes are slightly misaligned by an error in a process, or the like. An error occurring in the case in which the axes are slightly misaligned by an error in a process, or the like, may be less than 10 µm. An axis of an element in the present disclosure refers to a line parallel to a thickness direction of the semiconductor chip 120 (the thickness direction is a direction perpendicular to either the active surface or the inactive surface of the semiconductor chip 120) and passing through a center of the element. Stacked vias refer to vias stacked on one another and align to each other or overlap with each other in a direction parallel to the thickness direction of the semiconductor chip. Staggered vias refer to vias disposed at different levels and do not overlap with each other in a direction parallel to the thickness direction of the semiconductor chip.

In this case, the first via 143*a*-1 and the second via 143*b*-1, disposed in the first region R1, may be connected to at least one of a power pattern and a ground pattern. In addition, the third via 143*a*-2 and the fourth via 143*b*-2, disposed in the second region R2, may be connected to a signal pattern. The signal pattern may include various signals except for the power pattern, the ground pattern, and the like, such as a data signal, or the like. In other words, the power pattern and/or the ground pattern requiring a relatively short wiring distance may be disposed in the first region R1, thus providing a relatively short wiring distance through the first via 143*a*-1 and the second via 143*b*-1. In addition, the signal pattern, or the like, which may have a relatively long wiring distance, may be disposed in the second region R2, thus allowing a connection pad to be redistributed into a fan-out region through the third via 143*a*-2 and the fourth via 143*b*-2, disposed to disperse stress, as subsequently described.

In general, in a case in which a semiconductor package is mounted on a motherboard of an electronic device, or the like, stress caused by thermal expansion and contraction of the motherboard, and the like, may be transmitted to the semiconductor package through a connection terminal. In a case in which the stress is not dispersed, a fracture may occur in the connection pad of the semiconductor chip. Therefore, an open defect in a via of a redistribution layer connected to the connection pad may occur. In detail, the stress may be applied to an external region of a through hole in which the semiconductor chip is disposed. In more detail, a relatively high level of stress may be applied to the external region thereof surrounding a central region thereof, compared to the central region.

In an exemplary embodiment, vias 143*a* and 143*b* of the second connection member 140, disposed in the first region R1 to which a relatively low level of stress is applied and in the second region R2 to which a relatively high level of stress is applied, are provided as a combination of vias 143*a*-1, 143*b*-1, 143*a*-2, and 143*b*-2 having different dispositional forms. In detail, the first via 143*a*-1 and the second via 143*b*-1 in the first region R1 may be provided as stacked vias, while the third via 143*a*-2 and the fourth via 143*b*-2 in the second region R2 may be provided as staggered vias. In this case, the power pattern and/or the ground pattern, requiring a minimum wiring distance, may be disposed in the first region R1, thus improving performance of the semiconductor package. In addition, the signal pattern may be disposed in the second region R2, while board level reliability may be improved by an effect of stress dispersion according to a dispositional form of a via.

Hereinafter, each component included in the fan-out semiconductor package 100A, according to an exemplary embodiment, will be described in more detail.

The first connection member 110 may play a role in supporting the semiconductor package 100A, thus facilitating maintaining hardness thereof and securing a uniform thickness of the encapsulant 130. In addition, a routing area may be provided to form redistribution layers 112*a* and 112*b*, thus reducing a number of layers of the second connection member 140 and solving a problem of a defect occurring in a process of forming the second connection member 140. The first connection member 110 may have the through hole 110H. In the through hole 110H, the semiconductor chip 120 may be disposed to be spaced apart from the first connection member 110 by a predetermined interval. In other words, a side surface of the semiconductor chip 120 may be surrounded by the first connection member 110. However, the present disclosure is not limited thereto and may be varied to have a different form.

The first connection member 110 may include an insulating layer 111. In addition, the first connection member 110 may include the redistribution layers 112*a* and 112*b*, disposed on a side and an opposing side of the insulating layer 111, respectively. Furthermore, the first connection member 110 may include a via 113 penetrating through the insulating layer 111 and electrically connecting the redistribution layers 112*a* and 112*b* disposed on the surface and the opposing surface of the insulating layer 111, respectively. According to need, a metal layer 112*c* may be disposed on a wall surface of the first connection member 110 in the through hole 110H. Alternatively, the first connection member 110 may be configured to include a plurality of support layers, a redistribution layer may be further disposed between the plurality of insulating layers, and the via may also be configured to have a plurality of layers.

Any material that may support the package may be used as a material of the insulating layer 111, and is not limited to any specific material. For example, an insulating material may be used as a material of the insulating layer 111. In this case, a thermosetting resin, such as an epoxy resin, a thermoplastic resin, such as polyimide, or a resin formed in such a manner that the thermosetting resin and the thermoplastic resin are impregnated with a stiffener, such as glass cloth and/or an inorganic filler, for example, prepreg, Ajinomoto build-up film (ABF), FR-4, Bismaleimide Triazine (BT), or the like, may be used as the insulating material. According to need, a photo imagable dielectric (PID) resin may also be used as the insulating material.

The redistribution layers 112*a* and 112*b* may play a role as a redistribution pattern, and a raw material of the redistribution layers 112*a* and 112*b* may include a conductive material, such as copper (Cu), aluminum (Al), silver (Ag), tin (Sn), gold (Au), nickel (Ni), lead (Pb), titanium (Ti), or alloys thereof. The redistribution layers 112*a* and 112*b* may perform various functions according to design of a layer. In detail, the redistribution layers 112a and 112b may act as the ground pattern, the power pattern, the signal pattern, or the like. In this case, the signal pattern may include various signals except for the power pattern, the ground pattern, and the like, such as a data signal, or the like. In addition, the signal pattern may act as a via pad, a connection terminal pad, or the like.

The via 113 may electrically connect a redistribution layer 112a and a redistribution layer 112b, formed in different layers, thus forming an electrical path in the first connection member 110. A raw material of the via 113 may include a conductive material, such as Cu, Al, Ag, Sn, Au, Ni, Pb, Ti, or alloys thereof. An entirety of the via 113 may be filled with a conductive material. Alternatively, in a manner different from the exemplary embodiment, the conductive material may be formed on a wall surface of a via hole. In addition, an entirety of forms known in the art, such as a cylindrical form, a taper form, or the like, may be applied thereto.

The metal layer 112c may surround a side surface of the semiconductor chip 120, thus playing a role in effectively dissipating heat, generated by the semiconductor chip 120, outwardly. In addition, the metal layer 112c may play a role in blocking electromagnetic waves generated by the semiconductor chip 120. Electromagnetic waves generated on an exterior of the semiconductor package may be prevented from interfering with the semiconductor chip 120. The metal layer 112c may also include a conductive material known in the art, such as Cu, Al, Ag, Sn, Au, Ni, Pb, Ti, or alloys thereof, but is not limited thereto.

The semiconductor chip 120 may be provided as an integrated circuit (IC) in which hundreds to millions of or more devices are integrated in a single chip. The IC may be provided as an application processor chip, such as a central processor (e.g., a CPU), a graphics processor (e.g., a GPU), a digital signal processor, a cryptography processor, a microprocessor, a microcontroller, or the like, but is not limited thereto.

The semiconductor chip 120 may include a body 121, the connection pad 122 formed on a surface of the body 121, and a passivation film (not illustrated) formed on the surface of the body 121 and covering a portion of the connection pad 122. In detail, the body 121 may be formed based on an active wafer. In this case, silicon (Si), germanium (Ge), gallium arsenide (GaAs), or the like, may be used as a base material. The connection pad 122 may play a role in electrically connecting the semiconductor chip 120 to a different component. A raw material of the connection pad 122 may include a conductive material, in detail, Al. The connection pad 122 may be redistributed by the second connection member 140, the first connection member 110, and the like. The semiconductor chip 120 may have an active surface on which the connection pad 122 is formed and an inactive surface, an opposite surface of the active surface. The passivation film (not illustrated) may perform a function to protect the body 121 from external impacts. In detail, the passivation film may be formed using an oxide film, such as a silicon oxide (SiO), or the like, a nitride film, such as a silicon nitride (SiN), or the like, or a double layer including an oxide film and a nitride film. In addition, an additional insulating film (not illustrated) may be disposed between the body 121 and the connection pad 122 and between the body 121 and the passivation film (not illustrated).

The first region R1 of the second connection member 140 may include a first corresponding region R1 corresponding to a central portion of a semiconductor chip. In addition, a second region R2 may include a second corresponding region R2 surrounding the first corresponding region R1. In detail, the stacked vias may be disposed in the first corresponding region R1, and the staggered vias may be disposed in the second corresponding region R2, as described above.

The encapsulant 130 may have a composition to protect the first connection member 110 and/or the semiconductor chip 120. A form of encapsulation thereof is not limited to a specific form, and the encapsulant 130 may have a form of encapsulation to surround at least a portion of the first connection member 110 and/or the semiconductor chip 120. For example, space on an upper side of the first connection member 110 and the semiconductor chip 120 and space between the first connection member 110 and the semiconductor chip 120 in the through hole 110H may be filled with the encapsulant 130. In addition, at least a portion of space between the passivation film 123 of the semiconductor chip 120 and the second connection member 140 may be filled with the encapsulant 130. In the meantime, the through hole 110H may be filled with the encapsulant 130, so that the encapsulant 130 may act as an adhesive, and may reduce buckling, according to a specific material included therein. In the encapsulant 130, an opening 131 allowing at least a portion of the redistribution layer 112b formed in an upper side of the first connection member 110 to be exposed may be formed. The redistribution layer 112b that is exposed may be used as a marking pattern. Alternatively, the redistribution layer 112b that is exposed may be connected to a separate connection terminal, and the like, and may be applied to a package-on-package structure. In addition, the redistribution layer 112b that is exposed may include a component to which surface mounted technology (SMT) is applied, disposed thereon.

The encapsulant 130 may be formed using a plurality of layers including a plurality of materials. In detail, space in the through hole 110H may be filled with a first encapsulant, and the first connection member 110 and the semiconductor chip 120 may be covered with a second encapsulant. Alternatively, the space in the through hole 110H may be filled with the first encapsulant, and the first connection member 110 and the semiconductor chip 120 may be covered with the first encapsulant to a predetermined thickness. Subsequently, the first encapsulant may be covered with the second encapsulant to a predetermined thickness, again. In addition, various forms may be applied thereto.

A raw material of the encapsulant 130 is not limited to a specific material, but an insulating material may be used. In more detail, a material including an inorganic filler and an insulating resin, but not including glass cloth, such as ABF, or the like, may be used as a raw material of the encapsulant 130. In a case in which the material, including an inorganic filler and an insulating resin, but not including glass cloth, may be used as a raw material of the encapsulant 130, a problem of voids or delamination may be solved. In the meantime, the inorganic filler may be provided as an inorganic filler that is known in the art, while the insulating resin may be provided as an epoxy resin that is known in the art, or the like, but the present disclosure is not limited thereto.

The encapsulant 130 may include a conductive particle, in order to block electromagnetic waves, according to need. Any conductive particle that may block electromagnetic waves may be used. In detail, the conductive particle may be formed using Cu, Al, Ag, Sn, Au, Ni, Pb, Ti, solder, or the like. However, materials described above are only examples, and the present disclosure is not limited thereto.

The second connection member 140 may be configured to redistribute the connection pad 122 of the semiconductor chip 120. Tens to hundreds of connection pads 122 having various functions may be redistributed by the second connection member 140, and may be physically and/or electrically connected to an external source by the connection terminal 170 which will subsequently be described, according to a function thereof. The second connection member 140 may include insulating layers 141a and 141b, redistribution layers 142a and 142b disposed on the insulating layers 141a and 141b, and vias 143a and 143b penetrating through the insulating layers 141a and 141b and connecting the redistribution layers 142a and 142b, and the like. The second connection member 140 may include more insulating layers, redistribution layers, and vias than those illustrated in the exemplary embodiment, in some cases.

An insulating material may be used as a raw material of the insulating layers 141a and 141b. A PID material, such as the PID resin, may be used as the insulating material, besides the insulating material described above. In this case, the insulating layers 141a and 141b may be formed to be relatively thin, and ease of reaching a fine pitch of the vias 143a and 143b may be facilitated. Raw materials of the insulating layers 141a and 141b may be the same, and may be different, according to need. The insulating layers 141a and 141b may be integrated, so that a boundary thereof may not be clear, according to a process.

The redistribution layers 142a and 142b may substantially redistribute the connection pad. In addition, a conductive material, such as Cu, Al, Ag, Sn, Au, Ni, Pb, Ti, or alloys thereof, may be used as a raw material of the redistribution layers 142a and 142b. The redistribution layers 142a and 142b may perform various functions according to design of a layer. In detail, the redistribution layers 142a and 142b may act as the ground pattern, the power pattern, the signal pattern, or the like. In this case, the signal pattern may include various signals except for the power pattern, the ground pattern, and the like, such as a data signal, or the like. In addition, the signal pattern may act as a via pad, a connection terminal pad, or the like.

The vias 143a and 143b may allow the redistribution layers 142a and 142b, the connection pad 122, and the like, formed on different layers, to be electrically connected, thus forming an electrical path in the semiconductor package 110A. A raw material of the vias 143a and 143b may include a conductive material, such as Cu, Al, Ag, Sn, Au, Ni, Pb, Ti, or alloys thereof. An entirety of the vias 143a and 143b may also be filled with a conductive material. Alternatively, the conductive material may be formed only on a wall surface of the vias 143a and 143b. In addition, an entirety of forms known in the art, such as a cylindrical form, a taper form, or the like, may be applied thereto.

The second connection member 140 may include the first region R1 corresponding to the central portion of the through hole 110H. The first region R1 may include the first redistribution layer 142a-1 disposed between the first via 143a-1 and the second via 143b-1 and connecting the first via 143a-1 to the second via 143b-1, disposed therein. In addition, the first region R1 may include a second redistribution layer 142b-1 disposed in a layer different from that of the first redistribution layer 142a-1 and connected to the first redistribution layer 142a-1 through the second via 143b-1, disposed therein. The first redistribution layer 142a-1 may include a via pad for power and/or a via pad for grounding. In detail, the first via 143a-1 and the second via 143b-1 may be connected to the via pad for power and/or the via pad for grounding to be stacked, as illustrated in FIGS. 11A and 11B. As illustrated in FIG. 11A, the second redistribution layer 142b-1 may include a power plane and/or a ground plane. In addition, as illustrated in FIG. 11B, the second redistribution layer 142b-1 may include a connection terminal pad for power and/or a connection terminal pad for grounding.

The second connection member 140 may include the second region R2 surrounding the first region R1. The second region R2 may include the third redistribution layer 142a-2 disposed between the third via 143a-2 and the fourth via 143b-2 and connecting the third via 143a-2 to the fourth via 143b-2, disposed therein. In addition, the second region R2 may include a fourth redistribution layer 142b-2 disposed in a layer different from that of the third redistribution layer 142a-2 and connected to the third redistribution layer 142a-2 through the fourth via 143b-2, disposed therein. As illustrated in FIG. 12A, the third redistribution layer 142a-2 may include via pads for via pads for a signal 142a1 and 142a2 connected to the third via 143a-2 and the fourth via 143b-2, respectively, and may include a signal line 142a3 connecting the via pads for a signal 142a1 and 142a2. In detail, the third via 143a-2 and the fourth via 143b-2 may be disposed to be staggered through a dispositional form. Alternatively, in detail, the third redistribution layer 142a-2 may include a via pad for a signal 142a4 to which an entirety of the third via 143a-2 and the fourth via 143b-2 are connected to be staggered, as illustrated in FIG. 12B. As illustrated in FIGS. 12A and 12B, the fourth redistribution layer 142b-2 may include a connection terminal pad for a signal.

A via having a dispositional form the same as that in the second region R2 may also be disposed in a different region except for the first region R1 and the second region R2 of the second connection member 140, that is, a region corresponding to a peripheral region of the semiconductor package 100A. For example, in the different region, a via for a signal may be disposed to be staggered, and a via pad for a signal, a wiring line for a signal, and the like, connected to the via for a signal, may be disposed.

The passivation layer 150 may have a composition which may be introduced according to need and may protect the second connection member 140 from external physical and chemical damage, and the like. The passivation layer 150 may have the opening 151 allowing at least a portion of a redistribution layer 142 among the redistribution layers 142 of the second connection member 140 to be exposed. Tens to thousands of openings 151 may be formed in the passivation layer 150.

A raw material of the passivation layer 150 is not limited to a specific material. In detail, a PID material, such as a PID resin, may be used. Alternatively, a solder resist layer may also be used. Alternatively, an insulating material including a filler and a resin, but not including glass cloth, such as ABF, or the like, may also be used. A level of surface roughness of the passivation layer 150 may be lower than that of a prior art passivation layer. In a case in which the level of surface roughness thereof is relatively low, various side effects, such as a stain on a surface of a circuit, a difficulty in implementing a microcircuit, and the like, which may occur in a process of forming a circuit, may be reduced.

The under bump metal layer 160 may have a composition which may be introduced according to need and improve connection reliability of the connection terminal 170 which will subsequently be described, thus improving reliability of the semiconductor package. The under bump metal layer 160 may be formed in the opening 151, in order to be connected to the redistribution layer 142 that is exposed. The under bump metal layer 160 may include a seed layer formed on a surface of the redistribution layer 142 that is exposed, on a wall surface of the opening 151, and on a surface of the passivation layer 150, and may include a conductive layer formed on the seed layer. The seed layer and the conductive layer may include a conductive material known in the art, and in detail, may include electroless copper and electrolytic copper, respectively. The seed layer may be thinner than the conductive layer.

The connection terminal 170 may have a composition which may be introduced according to need and may physically and/or electrically connect the semiconductor package 100A to an external source. In detail, the fan-out semiconductor package 100A may be mounted on a motherboard of an electronic device by the connection terminal 170. The connection terminal 170 may be formed using a conductive material, such as solder, or the like. However, a material described above is only an example, and a material thereof is not limited thereto.

The connection terminal 170 may be provided as a land, a ball, a pin, or the like. The connection terminal 170 may be formed to have a multilayer structure or a single layer structure. In a case in which the connection terminal 170 is formed to have a multilayer structure, the connection terminal 170 may include a copper pillar and solder. In a case in which the connection terminal 170 is formed to have a single layer structure, the connection terminal 170 may include Tin—Ag solder or Cu. However, materials described above are also only examples, and the present disclosure is not limited thereto. A number, an interval, a dispositional form, and the like, of the connection terminals 170 are not specifically limited, but may be changed by those skilled in the art according to design. In detail, the number of the connection terminals 170 may be tens to thousands, according to a number of the semiconductor chips 120 and the connection pads 122, but is not limited thereto. The number of the connection terminals 170 may be more than thousands or less than tens.

At least one of the connection terminals 170 may be disposed in the fan-out region. The fan-out region refers to a region except for a region in which the semiconductor chip 120 is disposed. In other words, a semiconductor package 100, according to an exemplary embodiment, may be provided as a fan-out package. The fan-out package may be more reliable than a fan-in package, and may implement a plurality of input/output (I/O) terminals. In addition, 3D interconnection of the fan-out package is facilitated. Furthermore, since the fan-out package may be mounted on an electronic device without a separate substrate, the fan-out package may be manufactured to be relatively thin, compared to a ball grid array (BGA) package, a land grid array package (LGA) package, and the like. In addition, the fan-out package may have relatively high price competitiveness.

An axis of a first connection terminal 170-1 connected to the first via 143a-1 and the second via 143b-1, disposed in the first region R1, among the connection terminals 170, may be disposed to correspond to that of the first connection pad 122-1 connected to the first via 143a-1 and the second via 143b-1 in the first region R1, among the connection pads 122 of the semiconductor chip 120. In addition, an axis of a second connection terminal 170-2 connected to the third via 143a-2 and the fourth via 143b-2, disposed in the second region R2, among the connection terminals 170, may be disposed to be offset from that of the second connection pad 122-2 connected to the third via 143a-2 and the fourth via 143b-2 in the second region R2, among the connection pads 122 of the semiconductor chip 120. In this case, "correspond" is a concept including not only a case in which axes perfectly align with each other, but also a case in which the axes are slightly misaligned by an error in a process, or the like. Therefore, a wiring distance between the first connection pad 122-1 and the first connection terminal 170-1 may be shorter than a wiring distance between the second connection pad 122-2 and the second connection terminal 170-2. In addition, a dispositional form of vias from the second connection pad 122-2 to the second connection terminal 170-2 may be staggered. Consequently, performance of the semiconductor package 100A and board level reliability may be improved.

A capacitor 190 may have a composition which may be introduced according to need and may improve impedance of an electric current flowing in a power wiring in a low frequency region and a high frequency region. The capacitor 190 may be formed in the opening 151 of the passivation layer 150, and may be connected to the first via 143a-1 and the second via 143b-1, disposed in the first region R1, in detail, the via pad for power, and the like, thus being connected to the first connection pad 122-1 of the semiconductor chip 120. The capacitor 190 may be provided as a surface mounted technology (SMT)-type capacity known in the art, and may have a structure in which an electrode is disposed on a lower surface thereof. Since the capacitor 190 may be electrically connected to the semiconductor chip 120 by the first via 143a-1 and the second via 143b-1 of the first region R1, having a relative short wiring distance, electrical energy may be efficiently supplied thereto.

Figure 13:
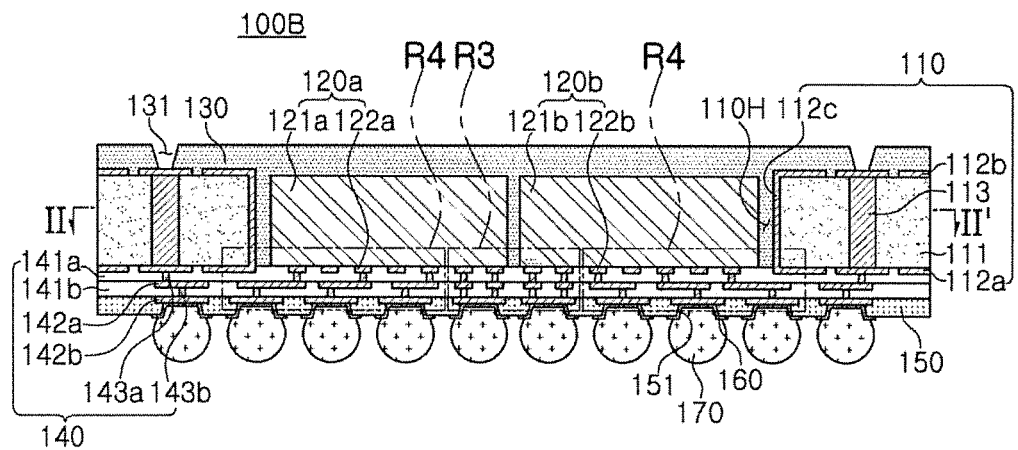
FIG. 13 is a schematic cross-sectional view of a different example of a fan-out semiconductor package.

FIG. 13 is a schematic cross-sectional view of a different example of a fan-out semiconductor package.

Figure 14:
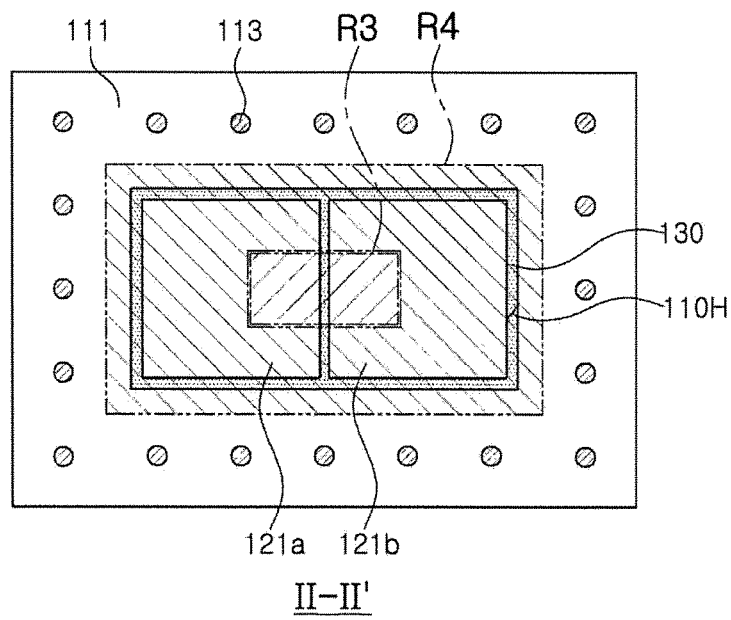
FIG. 14 is a schematic cross-sectional view taken along line II-II' of the fan-out semiconductor package of FIG. 13.

FIG. 14 is a schematic cross-sectional view taken along line II-II' of the fan-out semiconductor package of FIG. 13.

Hereinafter, a fan-out semiconductor package 100B, according to a different exemplary embodiment, will be described. However, a description thereof, overlapping a description provided above will be omitted, and only differences therebetween will be described.

With reference to the drawings, the fan-out semiconductor package 100B, according to a different exemplary embodiment, may include a plurality of semiconductor chips 120a and 120b, disposed in a through hole 110H. The plurality of semiconductor chips 120a and 120b may be provided as a first semiconductor chip 120a including a body 121a and a connection pad 122a, and may be provided as a second semiconductor chip 120b including a body 121b and a connection pad 122b, respectively. A second connection member 140 of the fan-out semiconductor package 100B, according to a different exemplary embodiment, may also include a first region R3 and a second region R4 surrounding the first region R3, having the same principle, as described above. In other words, a via disposed in the first region R3 and a via disposed in the second region R4 may have different dispositional forms. In detail, the first region R3 may include stacked vias disposed therein, while the second region R4 may include staggered vias disposed therein, as described above. In general, a power pattern and/or a ground pattern may be disposed in the first region R3, and may be connected to one or more of connection pads 122a and 122b of semiconductor chips 120a and 120b in the first region R3, a connection terminal 170, and the like through stacked vias. In addition, in general, a signal pattern may be disposed in the second region R4, and may be connected to one or more connection pads 122a and 122b of the semiconductor chips 120a and 120b in the second region R4, another connection terminal 170, and the like, through staggered vias. The first region R3 may include a third corresponding region R3 corresponding to a central portion of space between the first semiconductor chip 120a and the second semiconductor chip 120b and to a region extended inwardly of respective first semiconductor chip 120a and second semiconductor chip 120b, from the central portion. Furthermore, the second region R4 may include a fourth corresponding region R4 surrounding the third corresponding region R3.

Figure 15:
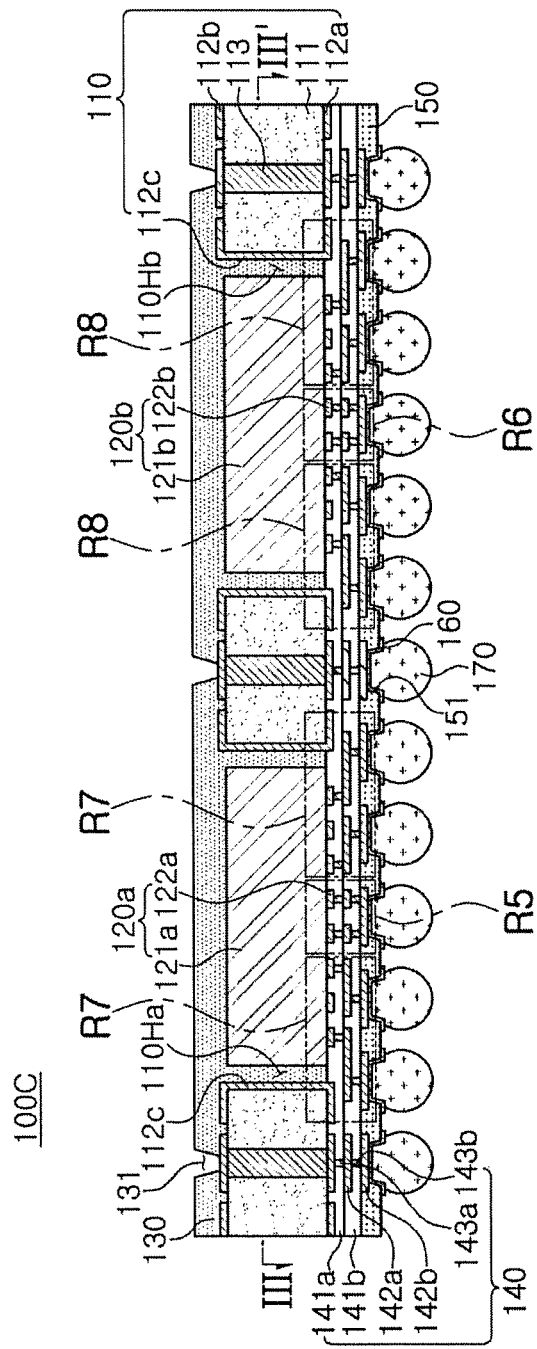
FIG. 15 is a schematic cross-sectional view of a different example of a fan-out semiconductor package.

FIG. 15 is a schematic cross-sectional view of a different example of a fan-out semiconductor package.

Figure 16:
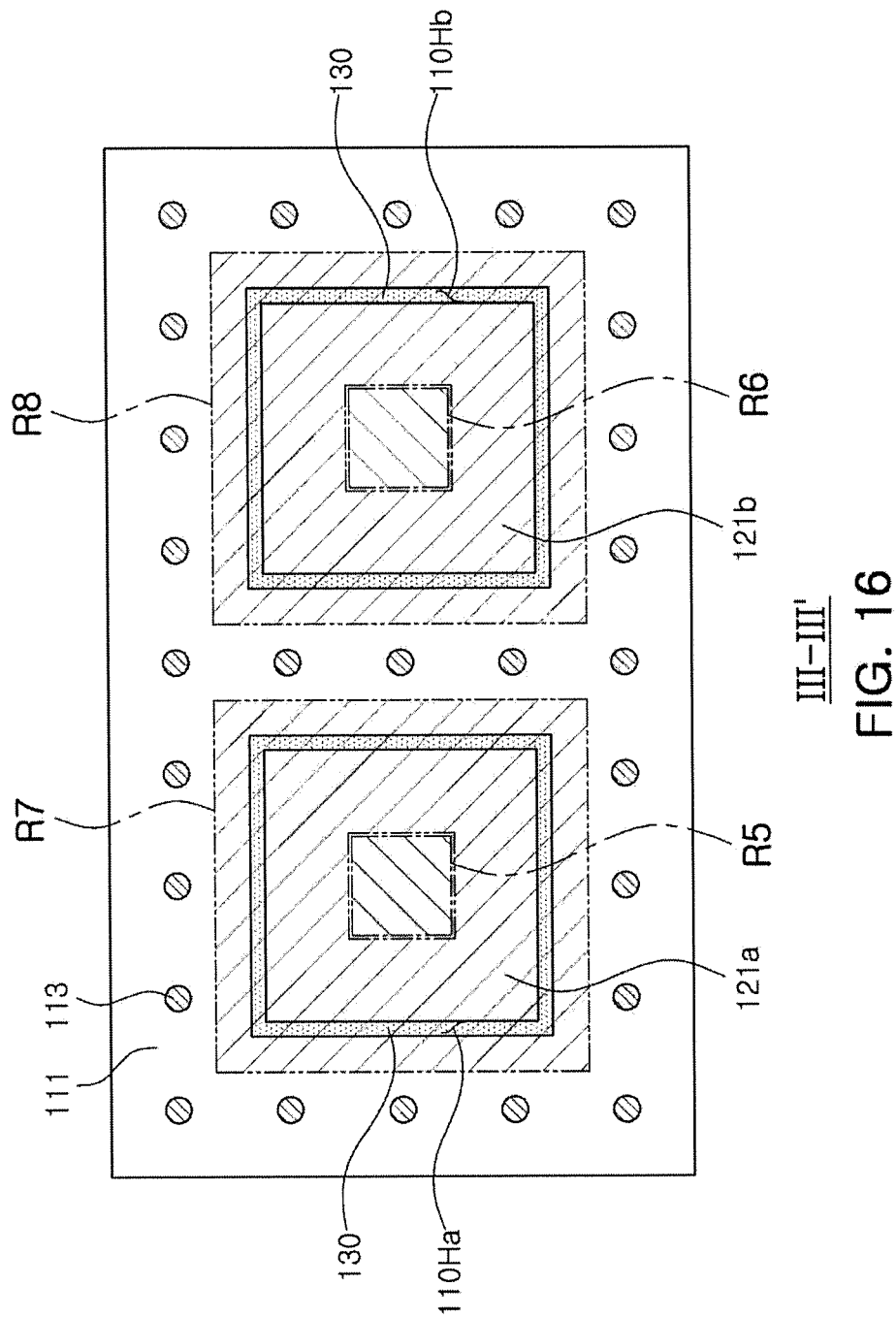
FIG. 16 is a schematic cross-sectional view taken along line III-III' of the fan-out semiconductor package of FIG. 15.

FIG. 16 is a schematic cross-sectional view taken along line III-III' of the fan-out semiconductor package of FIG. 15.

Hereinafter, a fan-out semiconductor package 100C, according to a different exemplary embodiment, will be described. However, a description thereof, overlapping a description provided above will be omitted, and only differences therebetween will be described.

With reference to the drawings, in the fan-out semiconductor package 100C, according to a different exemplary embodiment, a first connection member 110 may include a plurality of through holes 110Ha and 110Hb. A plurality of semiconductor chip 120a and 120b may be disposed in the plurality of through holes 110Ha and 110Hb, respectively. The plurality of semiconductor chips 120a and 120b may be provided as a first semiconductor chip 120a including a body 121a and a connection pad 122a, and may be provided as a second semiconductor chip 120b including a body 121b and a connection pad 122b, respectively. A second connection member 140 of the fan-out semiconductor package 100C, according to a different exemplary embodiment, may include first regions R5 and R6 and second regions R7 and R8 respectively surrounding the first regions R5 and R6, having the same principle, as described above. In other words, a via disposed in the first regions R5 and R6 may have a dispositional form different from that in the second regions R7 and R8. In detail, the first regions R5 and R6 may include stacked vias disposed therein, while the second regions R7 and R8 may include staggered vias disposed therein, as described above. In general, a power pattern and/or a ground pattern may be disposed in the first regions R5 and R6, and may be connected to one or more of connection pads 122a and 122b semiconductor chips 120a and 120b in the first regions R5 and R6, a connection terminal 170, and the like, through stacked vias. In addition, in general, a signal pattern may be disposed in the second regions R7 and R8, and may be connected to one or more of connection pads 122a and 122b of the semiconductor chips 120a and 120b in the second regions R7 and R8, another connection terminal 170, and the like, through staggered vias. The first regions R5 and R6 may include a fifth corresponding region R5 and a sixth corresponding region R6, corresponding to central portions of the first semiconductor chip 120a and the second semiconductor chip 120b, respectively. In addition, the second regions R7 and R8 may include a seventh corresponding region R7 and an eighth corresponding region R8, surrounding the fifth corresponding region R5 and the sixth corresponding region R6, respectively.

As set forth above, according to an exemplary embodiment, a fan-out semiconductor package having a new structure, allowing for excellent performance and improvement of reliability of board level may be provided.

While exemplary embodiments have been shown and described above, it will be apparent to those skilled in the art that modifications and variations could be made without departing from the scope of the present invention as defined by the appended claims.

The invention claimed is:

1. A fan-out semiconductor package, comprising:
an insulating layer having a through hole;
a semiconductor chip disposed in the through hole of the insulating layer and having an active surface on which connection pads are disposed and an inactive surface disposed opposite the active surface;
an encapsulant encapsulating at least a portion of the insulating layer and the semiconductor chip; and
a connection member disposed on the insulating layer and the active surface of the semiconductor chip and including a first region corresponding to a central portion of the through hole and a second region, surrounding the first region, corresponding to the central portion of the through hole,
wherein stacked vias electrically connected to one of the connection pads are disposed in the first region of the connection member, and staggered vias electrically connected to another of the connection pads are disposed in the second region of the connection member.

2. The fan-out semiconductor package of claim 1, further comprising connection terminals disposed on the connection member and electrically connected to the connection pad, wherein the connection terminals includes at least one connection terminal disposed in a fan-out region.

3. The fan-out semiconductor package of claim 2, further comprising a passivation layer disposed on the connection member and having an opening and an under bump metal layer formed in the opening of the passivation layer, wherein the connection terminal is formed on the under bump metal layer.

4. The fan-out semiconductor package of claim 2, further comprising a passivation layer disposed on the connection member and having the opening and a capacitor formed in the opening of the passivation layer, wherein the capacitor is electrically connected to the stacked vias and the staggered vias.

5. The fan-out semiconductor package of claim 1, wherein a single semiconductor chip is disposed in the through hole as the semiconductor chip, the first region includes a first corresponding region corresponding to a central portion of the semiconductor chip, and the second region includes a second corresponding region surrounding the first corresponding region corresponding to the central portion of the semiconductor chip.

6. The fan-out semiconductor package of claim 1, wherein a first semiconductor chip and a second semiconductor chip are disposed in the through hole as the semiconductor chip, the first region includes a third corresponding region corresponding to a central portion of space between the first semiconductor chip and the second semiconductor chip and a region extended inwardly of each of the first semiconductor chip and the second semiconductor chip from the central portion, and the second region includes a fourth corresponding region surrounding the third corresponding region.

7. The fan-out semiconductor package of claim 1, wherein the insulating layer includes a first through hole and a second through hole as the through hole, a first semiconductor chip and a second semiconductor chip are respectively disposed in the first through hole and the second through hole as the semiconductor chip, the first region includes a fifth corresponding region and a sixth corresponding region, corresponding to central portions of the first semiconductor chip and the second semiconductor chip, respectively, and the second region includes a seventh corresponding region and an eighth corresponding region, surrounding the fifth corresponding region and the sixth corresponding region, respectively.

8. A fan-out semiconductor package, comprising:

a first connection member having a through hole;

a semiconductor chip disposed in the through hole of the first connection member and having an active surface on which connection pads are disposed and an inactive surface opposing the active surface;

an encapsulant encapsulating at least a portion of the first connection member layer and the semiconductor chip; and a second connection member disposed on the first connection member layer and the active surface of the semiconductor chip and including a first region corresponding to a central portion of the through hole and a second region, surrounding the first region, corresponding to the central portion of the through hole, wherein stacked vias electrically connected to one of the connection pads are disposed in the first region of the second connection member, and staggered vias electrically connected to another of the connection pads are disposed in the second region of the second connection member, wherein the first connection member includes an insulating layer, a first redistribution layer and a second redistribution layer disposed on a side and an opposing side of the insulating layer, respectively, and a via penetrating through the insulating layer and electrically connecting the first and second redistribution layers, and wherein the first and second redistribution layers are electrically connected to the connection pads of the semiconductor chip.

* * * * *